(12) United States Patent
Yoshida

(10) Patent No.: US 8,845,135 B2
(45) Date of Patent: Sep. 30, 2014

(54) ELECTRIC WIRE HOLDING AND WATERPROOFING STRUCTURE AND LED UNIT

(75) Inventor: Kosuke Yoshida, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/883,076

(22) PCT Filed: Jan. 11, 2012

(86) PCT No.: PCT/JP2012/051005
§ 371 (c)(1),
(2), (4) Date: May 2, 2013

(87) PCT Pub. No.: WO2012/096406
PCT Pub. Date: Jul. 19, 2012

(65) Prior Publication Data
US 2013/0279183 A1 Oct. 24, 2013

(30) Foreign Application Priority Data
Jan. 12, 2011 (JP) ................... 2011-003551

(51) Int. Cl.
*B60Q 3/00* (2006.01)
*F21V 29/00* (2006.01)
*F21V 19/00* (2006.01)
*F21S 8/10* (2006.01)
*F21V 27/02* (2006.01)
*H05K 5/06* (2006.01)
*F21V 31/00* (2006.01)
*F21Y 101/02* (2006.01)

(52) U.S. Cl.
CPC ............ *F21V 19/003* (2013.01); *F21S 48/33* (2013.01); *F21V 27/02* (2013.01); *F21Y 2101/02* (2013.01); *H05K 5/06* (2013.01); *F21S 48/1109* (2013.01); *F21V 31/005* (2013.01); *F21S 48/215* (2013.01)
USPC ............ 362/267; 362/488; 362/489; 362/549

(58) Field of Classification Search
CPC ... F21V 19/00; F21V 19/001; F21V 19/0015; F21V 19/0025; F21V 19/003; F21V 19/0035; F21V 19/005; F21V 19/0005; F21V 21/00; F21V 21/02; F21V 27/00; F21V 27/02; F21V 31/00; F21V 31/04; B60Q 3/00; B60Q 3/02; B60Q 3/0203; B60Q 3/04; F21K 9/00; F21K 9/30; H05K 5/06
USPC ......... 362/488, 489, 548, 549, 267, 310, 382, 362/391, 800
See application file for complete search history.

(56) References Cited

U.S. PATENT DOCUMENTS 5,116,229 A 5/1992 Savage, Jr.
8,430,527 B2 * 4/2013 Lai ............................ 362/244
(Continued)

FOREIGN PATENT DOCUMENTS

DE 44 19 667 A1 12/1995
DE 202 05 631 U1 9/2002
(Continued)

OTHER PUBLICATIONS

Korean Office Action for the related Korean Patent Application No. 10-2013-7011086 dated Feb. 19, 2014.
(Continued)

*Primary Examiner* — Thomas M Sember
(74) *Attorney, Agent, or Firm* — Kenealy Vaidya LLP

(57) ABSTRACT

An electric wire holding and waterproofing structure includes a circuit board connected to an electric wire, a housing that accommodates the circuit board, a holder having a through hole for leading out the electric wire to the outside of the housing, a packing provided on an outer circumference of the holder so as to be brought into intimately contact with an inner circumference of the housing, a rubber plug attached to the electric wire so as to seal the through hole of the holder, and a cover fitted into the housing. When the cover is fitted into the housing, the holder and the cover hold the electric wire in a state that the electric wire has a bent portion.

15 Claims, 4 Drawing Sheets

(56) References Cited

U.S. PATENT DOCUMENTS

| | | | |
|---|---|---|---|
| 8,641,245 B2* | 2/2014 | Wu .............................. | 362/373 |
| 2010/0226140 A1 | 9/2010 | Mochizuki | |
| 2011/0085334 A1* | 4/2011 | Wang ....................... | 362/249.02 |
| 2012/0044711 A1 | 2/2012 | Konishi et al. | |

FOREIGN PATENT DOCUMENTS

| | | |
|---|---|---|
| DE | 203 02 614 U1 | 5/2003 |
| EP | 1 637 796 A2 | 3/2006 |
| EP | 1 679 228 A2 | 7/2006 |
| FR | 2 814 124 A3 | 3/2002 |
| JP | 3-101805 U | 10/1991 |
| JP | 2009-48929 A | 3/2009 |
| JP | 2010-212322 A | 9/2010 |
| WO | 2011/030375 A1 | 3/2011 |

OTHER PUBLICATIONS

International Search Report and Written Opinion of the International Search Report for PCT/JP2012/051005 dated Jun. 6, 2012.

* cited by examiner

ELECTRIC WIRE HOLDING AND WATERPROOFING STRUCTURE AND LED UNIT

TECHNICAL FIELD

The present invention relates to an electric wire holding and waterproofing structure and an LED unit having this structure.

BACKGROUND ART

For example, PTL 1 discloses an LED unit (LED lamp module) which is used in a motor vehicle as a light source of an interior illumination for illuminating an interior of a passenger compartment, an interior of a small article storage compartment such as a small article storage pocket or an ashtray, a cup holder itself or a foot of an user, or an LED unit which is used in a motor vehicle as a light source of an exterior illumination such as a stop lamp or a tail lamp.

In the LED unit disclosed in PTL 1, an electric wire is led out from a housing or a holder which makes up the LED unit. Looking at where the electric wire is so led out, it is found that no waterproofing structure is adapted to the LED unit.

Many waterproofing structures are proposed in the field of connectors, and for example, PTL 2 discloses one of such waterproofing structures. Hereinafter, referring to a drawing, the waterproofing structure disclosed in PTL 2 will be described.

In FIG. 4, a resin housing 1 has a rubber plug mounting hole 2 in a rear portion thereof. A rubber plug 3 and a rubber plug fastener 4 are inserted into the rubber plug mounting hole 2 from the rear thereof. A plurality of recess portions 5 are formed on an inner circumferential surface of the rubber plug mounting hole 2. Additionally, a projecting portion 6 is formed on an outer circumferential surface of the rubber plug fastener 4. The position of the rubber plug fastener 4 is adjusted by a retaining between the recess portions 5 and the projecting portions 6.

The rubber plug 3 and the rubber plug fastener 4 are fitted on an electric wire 7 in advance. The electric wire 7 has a connecting terminal 8 at an end thereof. The connecting terminal 8 is accommodated in a terminal accommodation chamber 9 in the housing 1 in a locked fashion. The terminal accommodation chamber 9 is formed so as to extend straight from a front end of the rubber plug mounting hole 2.

The infiltration of water into an interior of a connector 10 from the rear of the housing 1 or along the electric wire 7 is prevented by the rubber plug 3 which is fastened by the rubber plug fastener 4.

CITATION LIST

Patent Literature

[PTL 1] JP-A-2010-212322
[PTL 2] JP-A-2009-48929

SUMMARY OF INVENTION

Technical Problem

Incidentally, in the related art disclosed in PTL 2, since the housing 1 in which the plurality of recess portions 5 are formed on the inner circumferential surface of the rubber plug mounting hole 2 is used, a mold used for molding such a housing 1 from a resin material has to have a complex mold structure which needs a slide structure. As a result of this, there is caused a problem that the necessity of the mold having the complex mold structure increases the production costs of the connector 10. In addition, in the related art, since an equal number of rubber plug fasteners 4 to the number of rubber plug mounting holes 2 is required (an equal number of rubber plug fasteners 4 to the number of electric wires 7 or connecting terminals 8 is required), there is caused a problem that as the number of poles of connecting terminals 8 increases, the weight of the connector 10 increases or a problem that the number of assembling manhours is increased.

Additionally, in the related art described above, the electric wire 7 is led out so as to extend straight to the rear relative to the connecting terminal 8 which is accommodated in the locked fashion in the terminal accommodation chamber 9. Therefore, when a pulling force is applied to the electric wire 7, the force acts on the connecting portion between the electric wire 7 and the connecting terminal 8, as a result of which a problem is caused that the reliability in electrical connection is decreased.

The invention has been made in view of these situations, and a problem that the invention is to solve is to provide an electric wire holding and waterproofing structure which can avoid a risk of the structures of resin components being complicated which would result in relation to waterproofing and which can increase the reliability in electrical connection. In addition, another problem that the invention is to solve is to provide an LED unit which adopts the electric wire holding and waterproofing structure.

Solution to Problem

In order to achieve the above object, according to the present invention, there is provided an electric wire holding and waterproofing structure, comprising:
a circuit board connected to an electric wire;
a housing that accommodates the circuit board;
a holder having a through hole for leading out the electric wire to the outside of the housing;
a packing provided on an outer circumference of the holder so as to be brought into intimately contact with an inner circumference of the housing;
a rubber plug attached to the electric wire so as to seal the through hole of the holder; and
a cover fitted into the housing,
wherein when the cover is fitted into the housing, the holder and the cover hold the electric wire in a state that the electric wire has a bent portion.

According to the above configuration, waterproofing between the housing and the holder is effected by the packing, and waterproofing between the electric wire and the holder is effected by the rubber plug. In this waterproofing structure, there occurs no such situation that the structures of molds for molding the individual resin components from resin materials are complicated. In addition, according the first aspect of the invention, the electric wire is held between the cover and the holder in a condition that the electric wire has the bent portion. Therefore, even when a pulling force is applied to the electric wire, there occurs no such situation that the force directly acts on an electrical connecting portion (for example, a soldered portion or the like).

According to a second aspect of the invention, the cover has a retaining portion which prevents disengagement of the rubber plug.

According to the above configuration, the movement of the rubber plug can be prevented by the retaining portion on the cover, and therefore, the function in relation to waterproofing is stabilized.

According to a third aspect of the invention, the holder and the cover are formed so that the electric wire has the bent portion which has two substantially right angle bending parts within the holder.

According to the above configuration, the electric wire is bent twice substantially into the shape of a crank and is held in that bent state. Therefore, even when a pulling force is applied to the electric wire, the electric wire is restricted from moving in at least two positions, as a result of which there occurs no such situation that the pulling force acts on any electrical connecting portion.

According to the present invention, there is also provided LED unit comprising:

the electric wire holding and waterproofing structure according to the above first aspect; and an LED mounted on the circuit board.

According to the above configuration, the LED unit uses the electric wire holding and waterproofing structure set forth in any of the first to third aspects.

Advantageous Effects of Invention

The first aspect of the invention is advantageous in that the electric wire holding and waterproofing structure can obtain waterproofing without complicating a configuration of resin components and can increase the reliability in electrical connection.

The second aspect of the invention is advantageous in that the waterproofing structure can be improved further by preventing the disengagement of the rubber plug. In addition, the disengagement of the rubber plug is prevented without providing any exclusive part, and therefore, the waterproofing structure which is effective in preventing the increase in the number of components can be provided.

The third aspect of the invention is advantageous in that the electric wire holding structure can be provided which makes it difficult for the pulling force to be applied to the connecting portion between the electric wire and the circuit board.

The fourth aspect of the invention is advantageous in that the LED unit having the electric wire holding and waterproofing structure can be provided. The electric wire holding and waterproofing structure can obtain waterproofing without complicating a configuration of resin components and can increase the reliability in electrical connection.

DESCRIPTION OF EMBODIMENTS

An electric wire holding and waterproofing structure is a structure in which waterproofing is effected by a rubber plug provided on an electric wire and the electric wire is held in a position lying further rearwards than the rubber plug. An electric wire holding and waterproofing structure like this is suitable for an LED unit.

Figure 1:
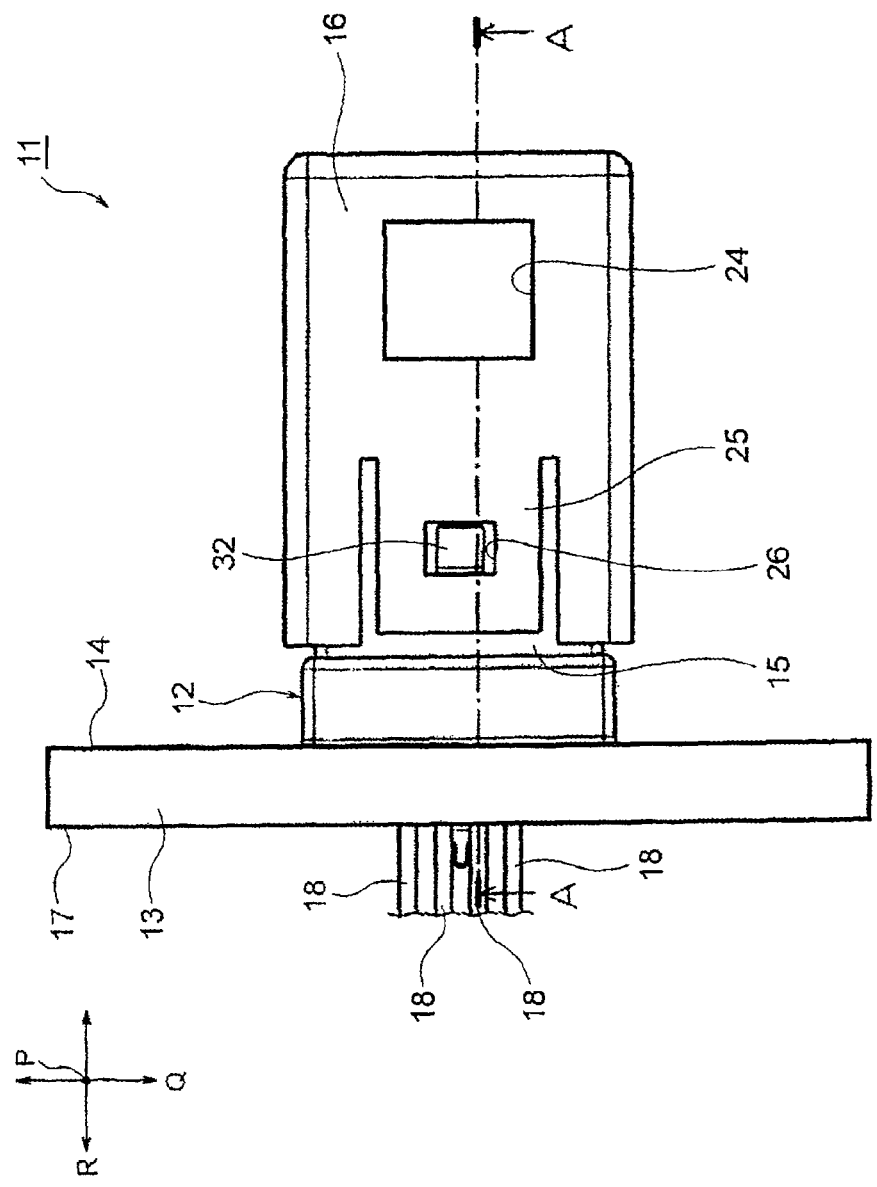
FIG. 1 is a plan view showing an LED unit according to an embodiment.
Figure 2:
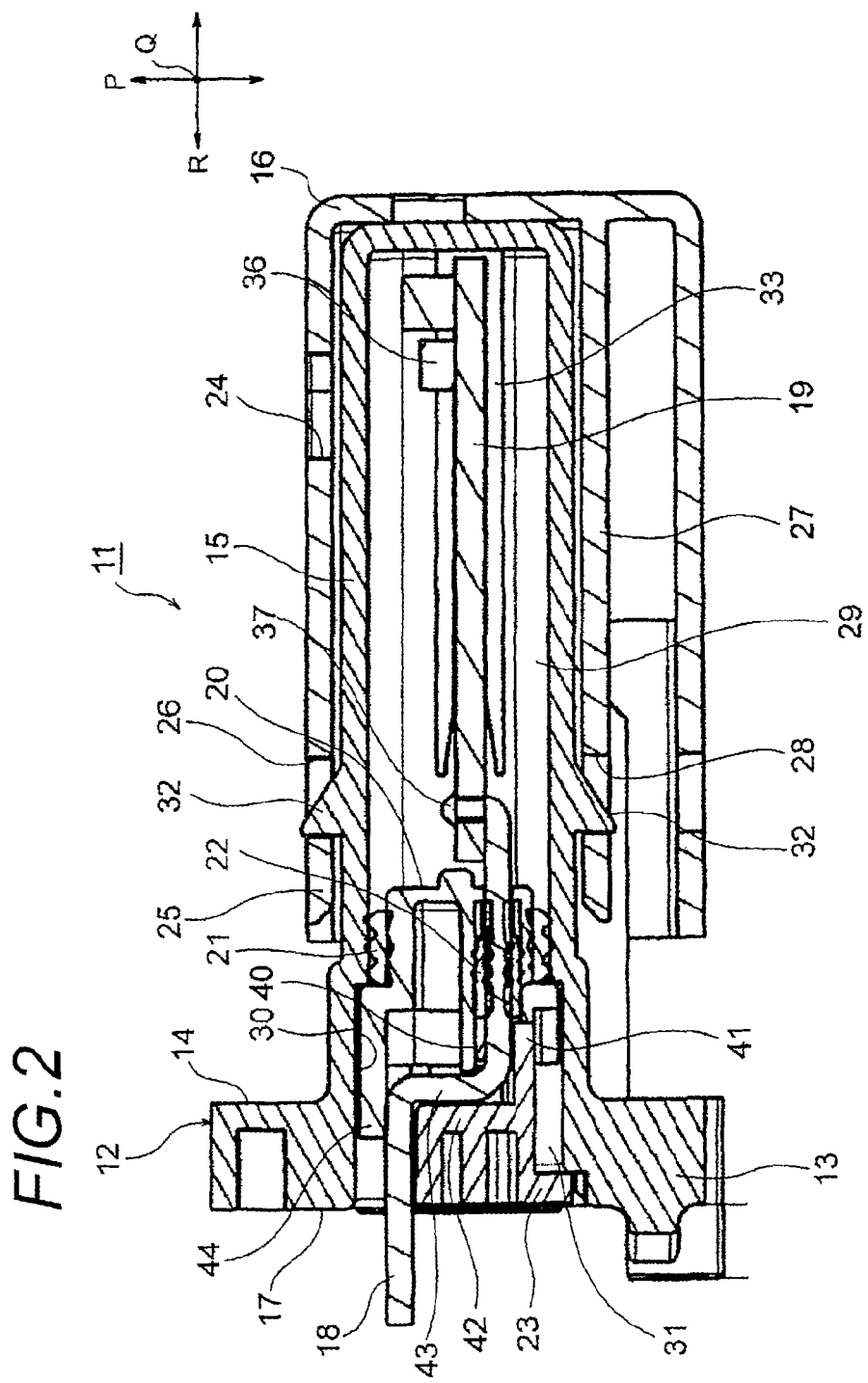
FIG. 2 is a sectional view taken along the line A-A in FIG. 1, showing an electric wire holding and waterproofing structure according to the embodiment.
Figure 3:
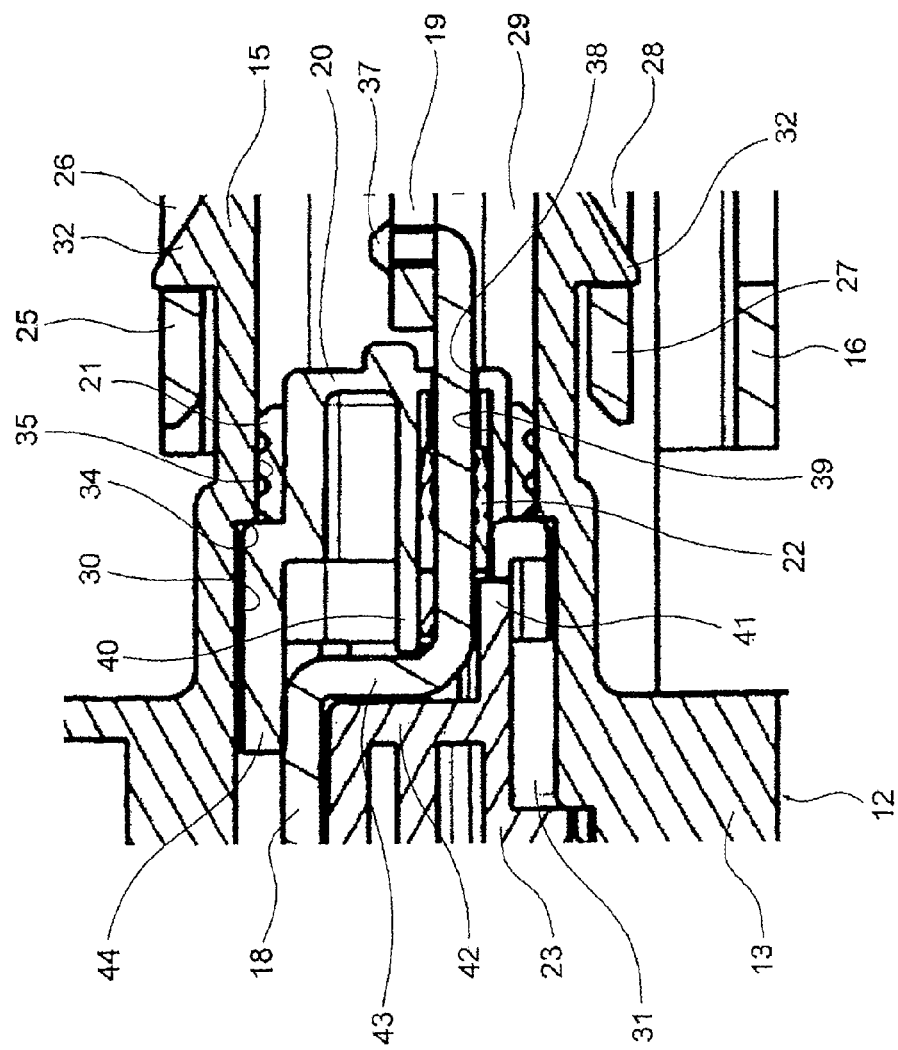
FIG. 3 is an enlarged view of a main part of the electric wire holding and waterproofing structure shown in FIG. 2.
Figure 4:
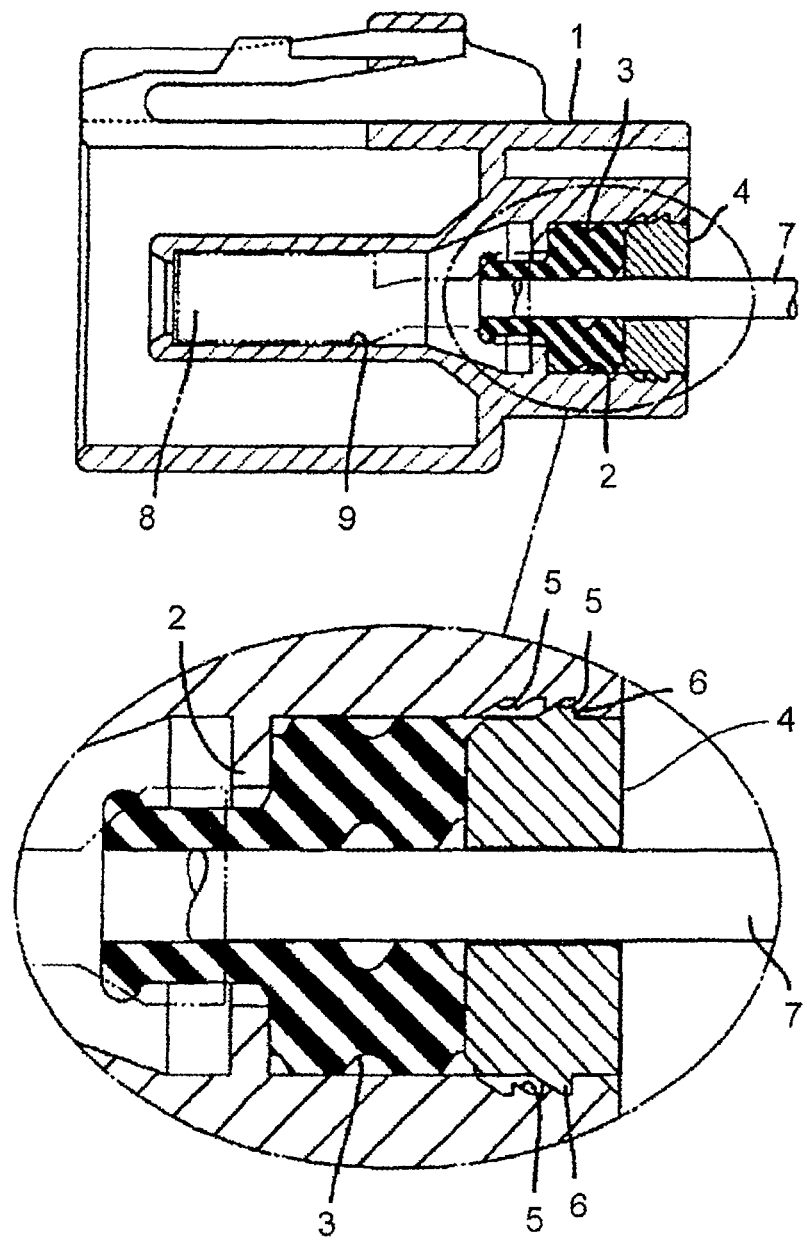
FIG. 4 shows a sectional view showing a waterproofing structure according to a conventional example together with an enlarged view of a main part thereof.

Hereinafter, referring to the drawings, an embodiment will be described. FIG. 1 is a plan view showing an LED unit according to an embodiment, and FIG. 2 is a sectional view taken along the line A-A in FIG. 1, showing an electric wire holding and waterproofing structure according to the embodiment. Further, FIG. 3 is an enlarged view of a main part of the electric wire holding and waterproofing structure shown in FIG. 2.

In FIG. 1, an LED unit 11 according to the invention can be used as a light source of an interior illumination or a light source of an exterior illumination and is constructed so that a design cover 16 is fitted on a housing main body 15 which projects from a front surface 14 of a fixing base portion 13 of a housing 12 so as to cover the housing main body 15 (an external appearance shown in FIG. 1 is an example). In addition, the LED unit 11 has an electric wire holding and waterproofing structure according to the invention in an interior of the housing main body 15. A plurality of electric wires 18 are led out from a rear surface 17 of the fixing base portion 13 and are connected to predetermined circuitries (not shown).

Hereinafter, a specific construction and configuration of the LED unit 11 will be described. In the drawings, an arrow P denotes a vertical direction, an arrow Q denotes a left-to-right or transverse direction, and an arrow R denotes a front-to-right or longitudinal direction. With respect to the vertical direction P, an illumination side (or a light's traveling side) is referred to as an upward side. With respect to the longitudinal direction R, a side facing the fixing base portion 13 is referred to as rear, and an opposite side thereto is referred to as front.

In FIGS. 1 and 2, the LED unit 11 includes the housing 12, the design cover 16 and the electric wires 18. Additionally, the LED unit 11 includes further a circuit board 19, a holder 20, a packing 21, rubber plugs 22 and a cover 23. In the LED unit 11, the plurality of electric wires 18 are provided, and an equal number of rubber plugs 22 to the number of electric wires 18 is provided. The other constituent components are provided as a single component. Namely, the LED unit 11 is configured by a least number of components.

The design cover 16 is placed on an outermost side of the LED unit 11 as a decorative portion and has a bottomed box shape which is opened only on a rear side thereof. Although not limited thereto, the design cover 16 is a product molded from a resin material. A rectangular window 24 is opened in an upper wall of the design cover 16 for passage of light. Reference numeral 25 given to the upper wall denotes an elastically deformable portion. A fitting hole 26 is formed in the elastically deformable portion 25 so as to penetrate therethrough. The fitting hole 26 is formed as a fitting lock portion where the design cover 16 is locked on the housing main body 15. As a fitting lock portion with the housing main body 15, a fitting hole 28 is also formed in a bulkhead 27 in an interior of the design cover 16.

In FIGS. 1 to 3, the housing 12 is a product molded from a transparent resin material having light transmissivity, as well as insulating properties. The housing main body 15 is covered by the design cover 16 from a front end to an intermediate portion thereof. In addition, the housing main body 15 is continuous with the front surface 14 of the fixing base portion 13 at a rear end thereof.

The housing 12 has a hollow shape so as to contain in an interior thereof a circuit board accommodation portion 29, a holder engagement portion 30 and a cover engagement portion 31.

The housing 12 is formed so that when the housing main body 15 is covered by the design cover 16 in the way described above, locking projections 32 which project from an upper wall and a lower wall of the housing main body 15 are engaged in the fitting holes 26, 28 formed in the design cover 16. Namely, the housing main body 15 is formed so as to engage with the design cover 16 in a locked state.

The circuit board accommodation portion 29 has a holding portion 33 which can hold the circuit board 19 in a sliding manner. The holder engagement portion 30 has a stopper 34 which is formed so as to have a stepped portion on an inner surface of the housing 12 to restrict the insertion amount of the holder 20 into the housing 12. Additionally, the holder engagement portion 30 has a seal surface 35 which enables the packing 21 to be brought into intimately contact with the inner surface of the housing 12 along the full inner circumference of the housing 12.

The holder engagement portion 30 is formed so as to enable the smooth insertion of the holder 20 into the housing 12. Similarly, the cover engagement portion 31 is also formed so as to allow the smooth insertion of the cover 23 into the housing 12. The cover engagement portion 31 is formed so as to lock the cover 23 therein so that the cover 23 is not disengaged from the cover engagement portion 31. The cover engagement portion 31 is formed so as to be opened to the rear surface 17 of the fixing base portion 13.

The circuit board 19 has a desired circuit pattern on a surface which constitutes an upper side of the circuit board in the drawings. The circuit board 19 also has an LED chip 36 (an LED) which is mounted thereon so as to be connected to the circuit pattern. The LED chip 36 has a light emitting element (a light emitting diode) which is disposed so that light is emitted from an upper surface thereof. When the light emitting element emits light, the light is then transmitted through the upper wall of the transparent housing main body 15 and passes through the window 24 in the design cover 16 so as to illuminate a predetermined portion.

The circuit board 19 has a connecting portion 37 (which corresponds to a soldered portion as described below) where an end of the electric wire 18 is electrically connected. The electric wire 18 is an insulated wire having a conductor and an insulator. An end of the conductor is inserted through a hole in the circuit board 19 from a rear surface to a front surface of the circuit board 19 and is then soldered to the circuit pattern. The electric wire 18 is held in a bent state between the cover 23 and the holder 20 within the housing 12 (which will be described later) and is then led out to the rear (outside) from the rear surface 17 of the fixing base portion 13.

The holder 20 is molded by a resin material having insulation properties. The packing 21 is assembled to an outer circumferential surface of a front portion of the holder 20. A known seal member is used for the packing 21. The packing 21 is brought into intimately contact with the seal surface 35 of the holder engagement portion 30 in accordance with insertion of the holder 20 into the housing 12, whereby a seal is established between the holder 20 and an inner surface of the housing main body 15 to effect waterproofing thereat.

The holder 20 has a lead-out hole 38 which is formed to penetrate through the holder 20 in a position matching the position of the electric wire 18, a rubber plug mounting hole 39 which communicates with the lead-out hole 38, and an electric wire abutment portion 40 for forming a bending portion of the electric wire 18. The electric wire 18 is inserted through the lead-out hole 38, and the rubber plug 22 assembled to the electric wire 18 in advance is tightly mounted in the rubber plug mounting hole 39. A seal surface (whose reference numeral is omitted) is formed on the rubber plug mounting hole 39, and when a seal is established between the seal surface of the rubber plug mounting hole 39 and the rubber plug 22, waterproofing can be effected thereat.

The holder 20 is inserted into the housing 12 until it is brought into abutment with the stopper 34 on the holder engagement portion 30. The electric wire 18 is brought into the electric wire abutment portion 40 in accordance with insertion of the cover 23 into the housing 12, whereby the electric wire 18 can be bent.

The cover 23 is similar to the holder 20 in that the cover 23 is molded by a resin material having insulation properties. The cover 23 is formed so as to be inserted into the cover engagement portion 31 to close the opening in the rear surface 17 of the fixing base portion 13. The cover 23 has a retaining portion 41 which projects as far as where the rubber plug 22 is present so as to restrict the movement of the rubber plug 22 and an electric wire abutment portion 42 which is brought into abutment with the electric wire 18 in accordance with the insertion of the cover 23 and forms a bending portion of the electric wire 18.

When the cover is inserted into the cover engagement portion 31 and is then locked therein, the electric wire 18 is brought into abutment with the electric wire abutment portions 40 and 42, whereby the electric wire 18 is bent twice substantially into the form of a crank to thereby form a bent portion 43 having two right angle bended portions within the holder 20. The electric wire 18 is also held at a rear end 44 of the holder 20 by being held between the rear end 44 and the cover 23.

In the configuration and construction described heretofore, according to the LED unit 11, waterproofing can be effected between the housing 12 and the holder 20. In addition, waterproofing can also be effected between the electric wire 18 and the holder 20. Looking at the waterproofing structure in the LED unit 11, the individual resin components can be molded without complicating the structures of molded involved in molding those resin components.

In addition, according to the LED unit 11, the electric wire 18 is held bent between the cover 23 and the holder 20. Therefore, even in the event that a pulling force is applied to the electric wire 18, the force so applied does not act directly on the soldered portion (the connecting portion 37) which is the electrical connecting portion, as a result of which the reliability in electrical connection can be enhanced.

Additionally, according to the LED unit 11, the movement of the rubber plug 22 can be prevented by the retaining portion 41 on the cover 23. Therefore, the function in relation to waterproofing can also be stabilized.

As is seen from the above description, the electric wire holding and waterproofing structure in the LED unit 11 is advantageous in that the structures of the resin components do not have to be complicated although waterproofing is properly effected. In addition, the electric wire holding and waterproofing structure is advantageous in that the electric wire 18 is held so firmly as to enhance the reliability in electrical connection.

The invention can, of course, be altered or modified variously without departing from the spirit and scope of the invention.

The present application is based on Japanese Patent Application No. 2011-003551 filed on Jan. 12, 2011, the contents of which are incorporated herein by reference.

INDUSTRIAL APPLICABILITY

By a configuration of the invention, the electric wire holding and waterproofing structure can achieve the waterproofing without complicating a configuration of resin components and can increase the reliability in electrical connection.

REFERENCE SIGNS LIST

11 LED unit
12 housing
13 fixing base portion
14 front surface
15 housing main body
16 design cover
17 rear surface
18 electric wire
19 circuit board
20 holder
21 packing
22 rubber plug
23 cover
24 window
25 elastically deformable portion
26, 28 fitting hole
7 bulkhead
29 circuit board accommodation portion
30 holder engagement portion
31 cover engagement portion
32 locking projection
33 holding portion
34 stopper
35 seal surface
36 LED chip (LED)
37 connecting portion
38 lead-out hole
39 rubber plug mounting hole
40, 42 electric wire abutment portion
41 retaining portion
43 bent portion
44 rear end

The invention claimed is:

1. An electric wire holding and waterproofing structure, comprising:
 a circuit board connected to an electric wire;
 a housing that accommodates the circuit board;
 a holder that is separate from the housing and extends within the housing, the holder having a through hole for leading out the electric wire to the outside of the housing;
 a packing provided on an outer circumference of the holder so as to be brought into intimate contact with an inner circumference of the housing;
 a rubber plug attached to the electric wire so as to seal the through hole of the holder; and
 a cover fitted into the housing,
 wherein when the cover is fitted into the housing, the holder and the cover hold the electric wire in a state that the electric wire has a bent portion.

2. The electric wire holding and waterproofing structure according to claim 1, wherein the cover has a retaining portion which prevents disengagement of the rubber plug.

3. The electric wire holding and waterproofing structure according to claim 1, wherein the holder and the cover are formed so that the electric wire has the bent portion which has two substantially right angle bending parts within the holder.

4. An LED unit comprising:
 the electric wire holding and waterproofing structure according to claim 1; and
 an LED mounted on the circuit board.

5. The electric wire holding and waterproofing structure according to claim 1, further including a holding portion that is separate from the housing, the holding portion being attached to the housing such that the circuit board is spaced from the housing.

6. The electric wire holding and waterproofing structure according to claim 1, further including a design cover that extends around an exterior of the housing, the design cover defining a window allowing for passage of light therethrough.

7. The electric wire holding and waterproofing structure according to claim 6, wherein the design cover defines a fitting hole, and the housing defines a locking projection that extends within the fitting hole to lock the design cover and housing together.

8. The electric wire holding and waterproofing structure according to claim 1, wherein the cover defines an outer planar surface and the holder defines an inner planar surface that is parallel to the outer planar surface of the cover, the wire extending between and contacting the outer planar surface of the cover and the inner planar surface of the holder so as to be guided in a direction that is parallel to a direction of elongation of the circuit board.

9. The electric wire holding and waterproofing structure according to claim 8, wherein the cover defines an inner planar surface that is perpendicular to the outer planar surface of the cover, the inner planar surface contacting the wire so as to guide the wire in a direction that is perpendicular to the direction of elongation of the circuit board.

10. The electric wire holding and waterproofing structure according to claim 9, wherein the cover defines an inner projection that defines a surface that contacts the wire to guide the wire in a direction that is parallel to the direction of elongation of the circuit board.

11. The electric wire holding and waterproofing structure according to claim 10, wherein the inner projection of the cover defines an innermost end that is adjacent an outer end of the rubber plug.

12. The electric wire holding and waterproofing structure according to claim 1, wherein the housing is defined by a single unitary element, and at least a portion of the cover extends within the unitary housing.

13. The electric wire holding and waterproofing structure according to claim 12, wherein the entire cover extends within the housing.

14. The electric wire holding and waterproofing structure according to claim 1, wherein the holder defines an inner projection, and the packing is coplanar with the inner projection of the holder such that the inner projection is defined within the packing.

15. The electric wire holding and waterproofing structure according to claim 1, wherein the packing is provided between the outer circumference of the holder and the inner circumference of the housing so as to be brought into intimate contact with both of the inner circumference of the housing and the outer circumference of the holder.

* * * * *